(12) United States Patent
Arora et al.

(10) Patent No.: US 7,834,657 B1
(45) Date of Patent: Nov. 16, 2010

(54) INVERTER CIRCUIT WITH COMPENSATION FOR THRESHOLD VOLTAGE VARIATIONS

(75) Inventors: Sunny Arora, Noida (IN); Mukesh Bansal, Haryana (IN); Dipesh K. Gupta, Noida (IN); Ankesh Jain, Agra (IN); Gaurav Jain, Kharar (IN); Ritika Singh, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/685,680

(22) Filed: Jan. 12, 2010

(51) Int. Cl.
*H03K 17/16* (2006.01)
*H03K 19/003* (2006.01)

(52) U.S. Cl. .............. 326/34; 326/32; 326/33; 327/37; 327/80; 327/537

(58) Field of Classification Search ........... 326/31–34; 327/37, 80, 530, 534, 537
See application file for complete search history.

(56) References Cited

U.S. PATENT DOCUMENTS

| | | | |
|---|---|---|---|
| 5,874,851 A * | 2/1999 | Shiota | 327/537 |
| 5,880,622 A * | 3/1999 | Evertt et al. | 327/535 |
| 6,184,704 B1 | 2/2001 | Wang | |
| 7,061,305 B2 | 6/2006 | Kim | |
| 7,439,759 B2 * | 10/2008 | Katoch et al. | 326/26 |
| 7,791,945 B2 * | 9/2010 | Shin et al. | 365/185.21 |
| 2005/0231268 A1 * | 10/2005 | Kim | 327/538 |

* cited by examiner

*Primary Examiner*—James H. Cho
*Assistant Examiner*—Jason M Crawford
(74) *Attorney, Agent, or Firm*—Charles Bergere (57) ABSTRACT

An inverter circuit has a digital signal amplitude converter having an input coupled to an inverter circuit input node, and an amplitude converter output. A positive threshold voltage compensation generator has a positive threshold voltage compensation generator input coupled to the amplitude converter output. A negative threshold voltage compensation generator has a negative threshold voltage compensation generator input coupled to the inverter circuit input node, and a negative threshold voltage compensation generator output. A multiplexer has a first input coupled to the positive threshold voltage compensation generator output, a second input, coupled to the negative threshold voltage compensation generator output, and a multiplexer output. An inverter module has an output providing an inverter circuit output node, and an inverter module input is coupled to the multiplexer output. The inverter circuit at least partially compensates for variations in a threshold voltage associated with switching of transistors that form the inverter module.

20 Claims, 5 Drawing Sheets

INVERTER CIRCUIT WITH COMPENSATION FOR THRESHOLD VOLTAGE VARIATIONS

BACKGROUND OF THE INVENTION

The present invention relates to an inverter circuit with gate to source threshold voltage compensation. More specifically, the present invention relates to an inverter circuit that at least partially compensates for variations in threshold voltages caused by manufacturing tolerances.

Field Effect Transistors, also known as Metal Oxide Semiconductor (MOS) transistors, are frequently used in numerous types of electronic circuits. Theses transistors form the basic components of a semiconductor integrated circuit and are typically formed on a doped substrate. On the substrate is deposited a metal oxide layer that is etched to form the gate source and drain electrodes. However, the miniaturization of MOS transistors makes it is difficult to consistently manufacture batches of semiconductor integrated circuits with exactly the same substrate doping levels that have exactly the same etched dimensions and positions of gate source and drain electrodes.

The inconsistencies in manufacturing MOS transistors (manufacturing tolerances), although small, result in variations in the transistor's gate to source threshold voltage Vth. Consequently, at the time of manufacture the exact threshold voltage Vth for a MOS transistor is generally unknown and only it's value+/−a manufacturing tolerance is known. This threshold voltage Vth is the minimum voltage required to make a MOS transistor conduct and can affect the desired output for even relatively simple circuits. For instance, one simple circuit is a pulse generator comprising a two input OR gate with a first input coupled to a directly to a clock and a second input coupled to the clock through three inverters. The inverters cause a delay in the clock reaching the second input of the OR gate and this delay affects the width of the generated pulse at the output of the OR gate. If the pulse generator is formed by MOS transistors then the inverter's response time, due to the threshold voltage Vth variations, can result in the width of the generated pulse varying considerably for different batches of manufactured pulse generators.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Further, terms "comprises," "comprising," or any other variation thereof, are intended to cover a non-exclusive inclusion, such that circuit, device components and method steps that comprises a list of elements or steps does not include only those elements but may include other elements or steps not expressly listed or inherent to such circuit, device components or steps. An element or step proceeded by "comprises . . . a" does not, without more constraints, preclude the existence of additional identical elements or steps that comprises the element or step.

In one embodiment, the present invention provides an inverter circuit with compensation for threshold voltage variations. The inverter circuit has a ground reference node, a primary voltage supply node, a secondary voltage supply node, an inverter circuit input node and an inverter circuit output node. There is a digital signal amplitude converter having an amplitude converter input, coupled to the inverter circuit input node, and an amplitude converter output, the digital signal amplitude converter being coupled to the secondary supply node and the ground reference node. There is also a positive threshold voltage compensation generator having a positive threshold voltage compensation generator input, coupled to the amplitude converter output, and a positive threshold voltage compensation generator output, the positive threshold voltage compensation generator being coupled to the secondary supply node and the primary voltage supply node. The inverter circuit has a negative threshold voltage compensation generator having a negative threshold voltage compensation generator input, coupled to the inverter circuit input node, and a negative threshold voltage compensation generator output. The inverter circuit also includes a multiplexer having a first input, coupled to the positive threshold voltage compensation generator output, a second input, coupled to the negative threshold voltage compensation generator output, and a multiplexer output. There is an inverter module with an output providing the inverter circuit output node, the inverter module having an inverter module input coupled to the multiplexer output and being coupled to the primary supply node and ground reference node.

In another embodiment, the present invention provides an inverter circuit with compensation for threshold voltage variations. The inverter circuit has a ground reference node, a primary voltage supply node, a secondary voltage supply node, an inverter circuit input node and an inverter circuit output node. There is a digital signal amplitude converter having an amplitude converter input, coupled to the inverter circuit input node, and an amplitude converter output, the digital signal amplitude converter being coupled to the secondary supply node and the ground reference node. There is also a positive threshold voltage compensation generator having a positive threshold voltage compensation generator input, coupled to the amplitude converter output, and a positive threshold voltage compensation generator output, the positive threshold voltage compensation generator being coupled to the secondary supply node and the primary voltage supply node. The inverter circuit has a negative threshold voltage compensation generator having a negative threshold voltage compensation generator input, coupled to the inverter circuit input node, and a negative threshold voltage compensation generator output. The inverter circuit also includes a multiplexer having a first input, coupled to the positive threshold voltage compensation generator output, a second input, coupled to the negative threshold voltage compensation generator output, and a multiplexer output. There is an inverter module with an output providing the inverter circuit output node, the inverter module having an inverter module input coupled to the multiplexer output and being coupled to the primary supply node and ground reference node. In operation, an input digital signal is supplied to the inverter circuit input node, the input digital signal being a signal that changes value between a primary voltage supplied by the primary voltage supply node and a ground potential corresponding to a potential at the ground reference node. The inverter circuit processes the input digital signal into a threshold voltage compensation signal, provided to the inverter module input, and the threshold voltage compensation signal controls switching of the pair of series coupled field effect transistors and at least partially compensates for variations in a threshold voltage associated with the switching.

Figure 1:
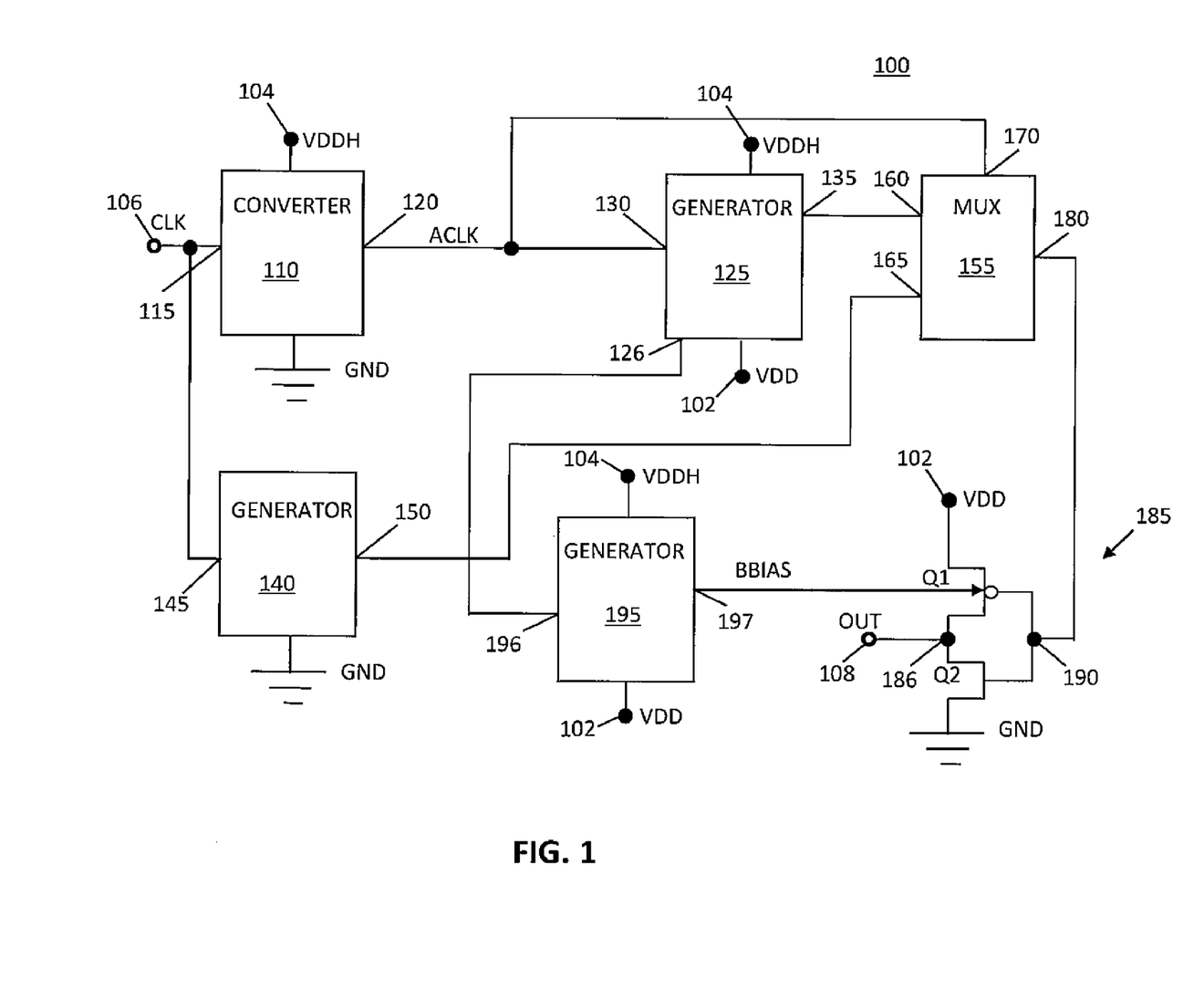
FIG. 1 is a schematic circuit diagram of an inverter circuit with compensation for threshold voltage variations in accordance with an embodiment of the present invention.

Referring to FIG. 1 there is illustrated a schematic circuit diagram of inverter circuit 100 with compensation for threshold voltage variations in accordance with an embodiment of the present invention. The inverter circuit 100 includes a ground reference node GND, a primary voltage supply node 102, a secondary voltage supply node 104, an inverter circuit input node 106 and an inverter circuit output node 108. In operation the primary voltage supply node 102 provides a primary voltage VDD, the secondary voltage supply node 104 provides a secondary voltage VDDH and the ground reference node GND at ground potential GROUND. The secondary voltage VDDH is at least 20% greater than the primary voltage VDD and no more than 30% greater than the primary voltage VDD. Typically, the secondary voltage VDDH is selected to be at least equal to the sum of the primary voltage VDD and a maximum possible gate to source threshold voltage Vth associated with the pair of series coupled field effect transistors Q1 and Q2 that are part of the inverter circuit 100. As will be apparent to a person skilled in the art, this maximum possible gate to source threshold voltage Vth is the maximum threshold voltage based on the maximum manufacturing tolerances as stipulated by the manufacturer's specifications.

There is a digital signal amplitude converter 110 that has an amplitude converter input 115, coupled to the inverter circuit input node 106, and an amplitude converter output 120. The digital signal amplitude converter 110 is coupled to the secondary supply node 104 and the ground reference node GND and therefore the digital signal amplitude converter 110 is powered by a supply voltage between the secondary voltage VDDH and ground potential GROUND.

The inverter circuit 100 has a positive threshold voltage compensation generator 125 with a positive threshold voltage compensation generator input 130, coupled to the amplitude converter output 120, and a positive threshold voltage compensation generator output 135. The positive threshold voltage compensation generator 125 is coupled to the secondary supply node 104 and the primary voltage supply node 102 and therefore the positive threshold voltage compensation generator 125 is powered by a supply voltage the between the secondary voltage VDDH and primary voltage VDD. Furthermore, the positive threshold voltage compensation generator 125 also includes a pulse generator (described later) that provides pulses, at a pulse generator output 126, that change value between the ground potential GROUND and the secondary voltage VDDH.

There is a negative threshold voltage compensation generator 140 that has a negative threshold voltage compensation generator input 145, coupled to the inverter circuit input node 106, and a negative threshold voltage compensation generator output 150. The negative threshold voltage compensation generator 140 is coupled to the ground reference node GND and no other power supply node.

There is also a multiplexer 155 that has a first input 160, coupled to the positive threshold voltage compensation generator output 135, a second input 165, coupled to the negative threshold voltage compensation generator output 150, a selection input 170 that is coupled to the amplitude converter output 120, and a multiplexer output 180. In this embodiment, the first input 160 is coupled to the multiplexer output 180 when the selection input 170 is at the ground potential and the second input 165 is coupled to the multiplexer output 180 when the selection input 170 is at the secondary voltage VDDH.

The inverter circuit 100 has an inverter module 185 with an inverter module input 190 coupled to the multiplexer output 180. The inverter module 185 is coupled to the primary supply node 102 and ground reference node GND. The inverter module 185 is therefore powered by a supply voltage between the primary voltage VDD and ground potential GROUND.

The inverter module 185 includes a pair of series coupled field effect transistors in the form of a P-type field effect transistor Q1 and an N-type field effect transistor Q2. Gates of the P-type field effect transistor Q1 and N-type field effect transistor Q2 are coupled to the inverter module input 190. A source electrode of the P-type field effect transistor Q1 is coupled to the primary voltage supply node 102 and a source electrode of the N-type field effect transistor Q2 is coupled to the ground reference node GND. A drain electrode of the P-type field effect transistor Q1 and a drain electrode of the N-type field effect transistor Q2 are directly coupled together at a common node 186 that provides the inverter circuit output node 108.

There is a back biasing voltage generator 195 with an input 196 coupled to the pulse generator output 126 of the positive threshold voltage compensation generator 125. An output 197 of the back biasing voltage generator 195 is coupled to a substrate electrode of the P-type field effect transistor Q1. The back biasing voltage generator 195 is coupled to the secondary supply node 104 and the primary voltage supply node 102 and therefore the back biasing voltage generator 195 is powered by a supply voltage the between the secondary voltage VDDH and the primary voltage VDD.

Figure 2:
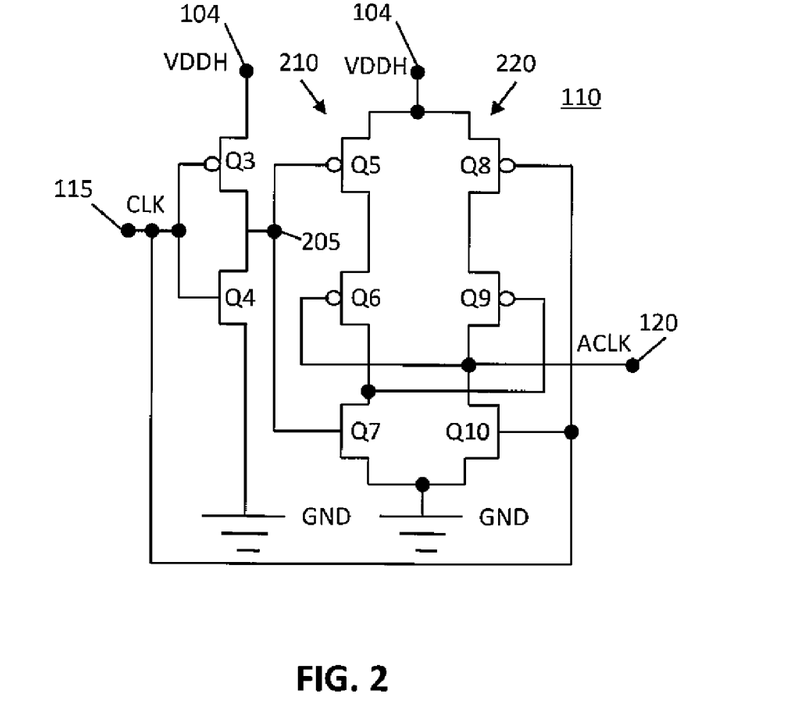
FIG. 2 is a transistor level schematic diagram of the digital signal amplitude converter, forming part of the inverter circuit of FIG. 1, in accordance with an embodiment of the present invention.

Referring to FIG. 2 there is illustrated a transistor level schematic diagram of the digital signal amplitude converter 110 in accordance with an embodiment of the present invention. The digital signal amplitude converter 110 includes an inverter comprising a P-type field effect transistor Q3 coupled in series with an N-type field effect transistor Q4. Gates of the transistors Q3 and Q4 are coupled to the amplitude converter input 115, a drain electrode of the P-type field effect transistor Q3 is coupled to the secondary supply node 104 and a drain electrode of the N-type field effect transistor Q4 is coupled to the ground reference node GND. Respective source and drain electrodes of the transistors Q3 and Q4 are directly coupled together to provide and inverter output 205.

The digital signal amplitude converter 110 also includes a first group 210 of series connected transistors and a second group 220 of series connected transistors. Both the first group 210 and second group 220 are connected across the secondary supply node 104 and ground reference node GND. The first group 210 includes a P-type field effect transistor Q5 with a source electrode coupled to the secondary supply node 104 and a drain electrode coupled to a source electrode of another P-type field effect transistor Q6. A drain electrode of the P-type field effect transistor Q6 is coupled to a drain electrode of an N-type field effect transistor Q7 that has a source electrode coupled to the ground reference node GND. The second group 220 also includes a P-type field effect transistor Q8 with a source electrode coupled to the secondary supply node 104 and a drain electrode coupled to a source electrode of another P-type field effect transistor Q9. A drain electrode of the P-type field effect transistor Q9 is coupled to a drain electrode of an N-type field effect transistor Q10 that has a source electrode coupled to the ground reference node GND. Gates of transistors Q5 and Q7 are coupled to the inverter output 205 and gates of the transistors Q8 and Q10 are coupled to the amplitude converter input 115. A gate of the transistor Q6 is coupled to the drain electrode of transistor Q9 and a gate of the transistor Q9 is coupled to the drain electrode of transistor Q6. As shown, the drain electrode of transistor Q9 provides the amplitude converter output 120.

Figure 3:
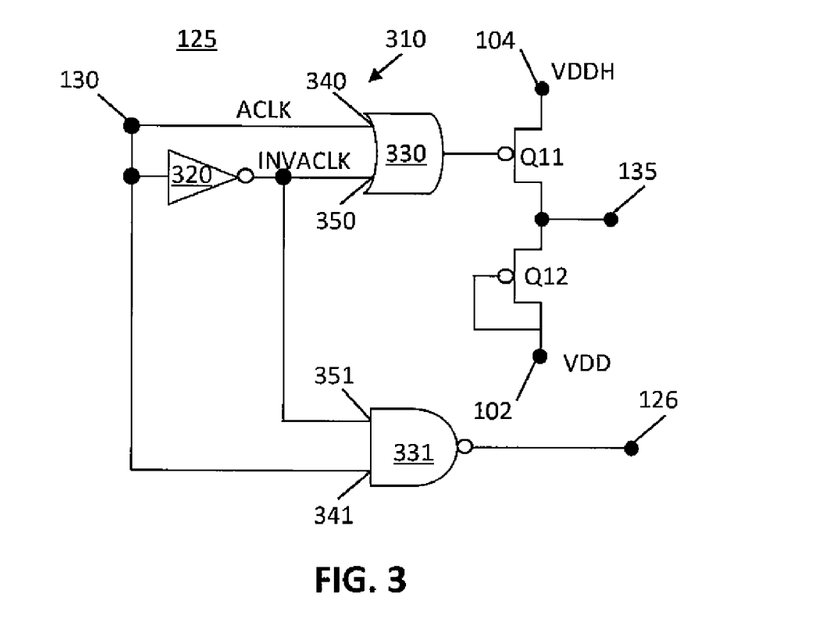
FIG. 3 is a schematic diagram of the positive threshold voltage compensation generator, forming part of the inverter circuit of FIG. 1, in accordance with an embodiment of the present invention.

Referring to FIG. 3 there is illustrated a schematic diagram of the positive threshold voltage compensation generator 125 in accordance with an embodiment of the present invention. The positive threshold voltage compensation generator 125 includes a pulse generator 310 with a pulse generator input providing the positive threshold voltage compensation generator input 130. The pulse generator 310 includes an OR gate 330. One input 340 of the OR gate 330 is directly coupled to the threshold voltage compensation generator input 130 and a second input 350 of the OR gate 330 is coupled through an inverter 320 to the threshold voltage compensation generator input 130. There is also a NAND gate 331 the output of which is the pulse generator output 126. One input 341 of the NAND gate 331 is directly coupled to the threshold voltage compensation generator input 130 and a second input 351 of the NAND gate 331 is coupled through the inverter 320 to the threshold voltage compensation generator input 130.

The positive threshold voltage compensation generator 125 also includes two P-type series connected field effect transistors coupled between the secondary voltage supply node 104 and the primary voltage supply node 102. A first transistor Q11 of the series connected field effect transistors has a gate electrode coupled to an output of the OR gate 330 and another electrode (source electrode) coupled directly to the secondary voltage supply node 104. A second transistor Q12 of the series connected field effect transistors has both a both a gate and drain electrode coupled to the primary voltage supply node 102. Also, a drain electrode of the first transistor Q11 and a source electrode of the second transistor Q12 are coupled together at the at the positive threshold voltage compensation generator output 135. It should be noted that in one alternative embodiment the OR gate could be replaced with a NOR gate and the two P-type series connected field effect transistors could be replaced with N-type field effect transistors.

Figure 4:
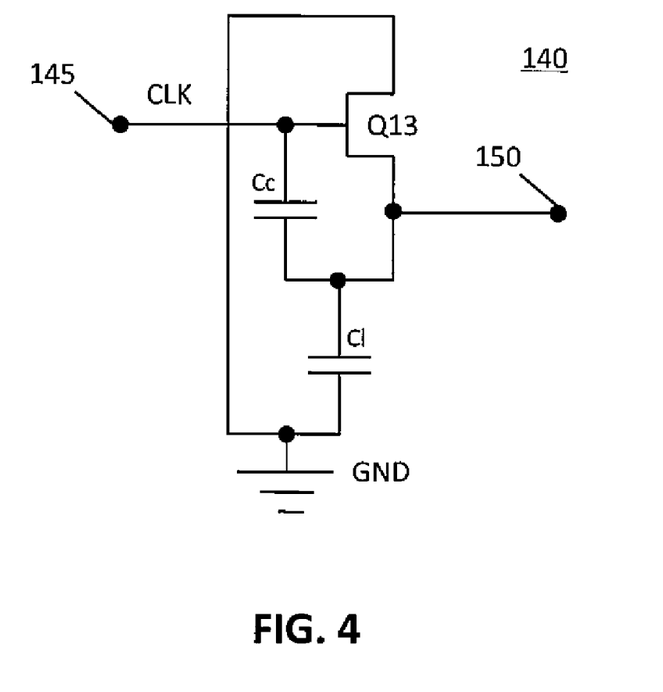
FIG. 4 is a transistor level schematic diagram of the negative threshold voltage compensation generator, forming part of the inverter circuit of FIG. 1, in accordance with an embodiment of the present invention.

Referring to FIG. 4 there is illustrated a transistor level schematic diagram of the negative threshold voltage compensation generator 140, in accordance with an embodiment of the present invention. The negative threshold voltage compensation generator 140 is a voltage bootstrap circuit that includes an N-type field effect transistor Q13 having a gate coupled to the negative threshold voltage compensation generator input 145 and coupled across the gate and source electrode of the transistor Q13 is a coupling capacitor Cc. A load capacitor C1 couples the source electrode of the transistor Q13 to the ground reference node GND and a drain of the transistor Q13 is coupled directly to the ground reference node GND. The source electrode of the transistor Q13 provides the negative threshold voltage compensation generator output 150.

Figure 5:
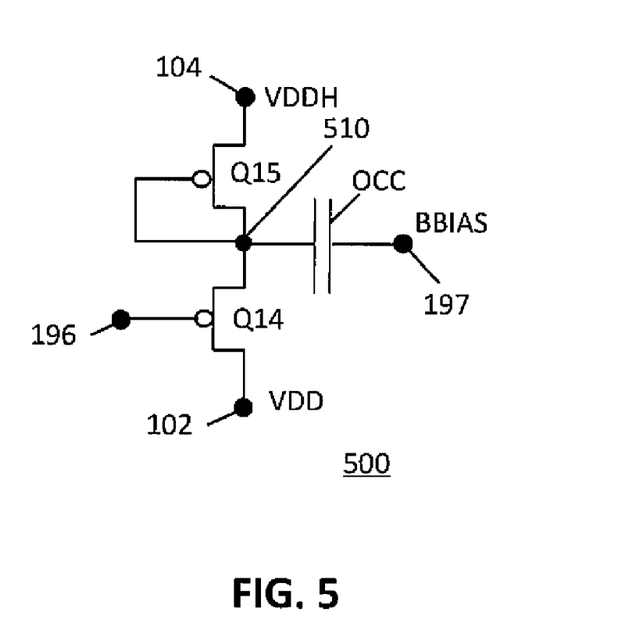
FIG. 5 is a transistor level schematic diagram of a back biasing voltage generator forming part of the inverter circuit of FIG. 1, in accordance with a preferred embodiment of the present invention.

Referring to FIG. 5 there is illustrated a transistor level schematic diagram of the back biasing voltage generator 195, in accordance with a preferred embodiment of the present invention. The back biasing voltage generator 195 includes two P-type series connected field effect transistors coupled between the secondary voltage supply node 104 and the primary voltage supply node 102. A first transistor Q14 of the series connected field effect transistors has a gate coupled via the input 196 to the to the pulse generator output 126 and a drain electrode coupled directly to the primary voltage supply node 102. A second transistor Q15 of the series connected field effect transistors has both a both a gate and drain electrode coupled together and a source electrode coupled to the secondary voltage supply node 104. Also, a source electrode of the first transistor Q14 and the drain and source electrodes of the second transistor Q15 are coupled together at a common node 510. An output coupling capacitor OCC couples the common node 510 to the output 197 of the back biasing voltage generator 195 therefore supplying a back biasing voltage BBIAS to the substrate electrode of the P-type field effect transistor Q1.

Figure 6:
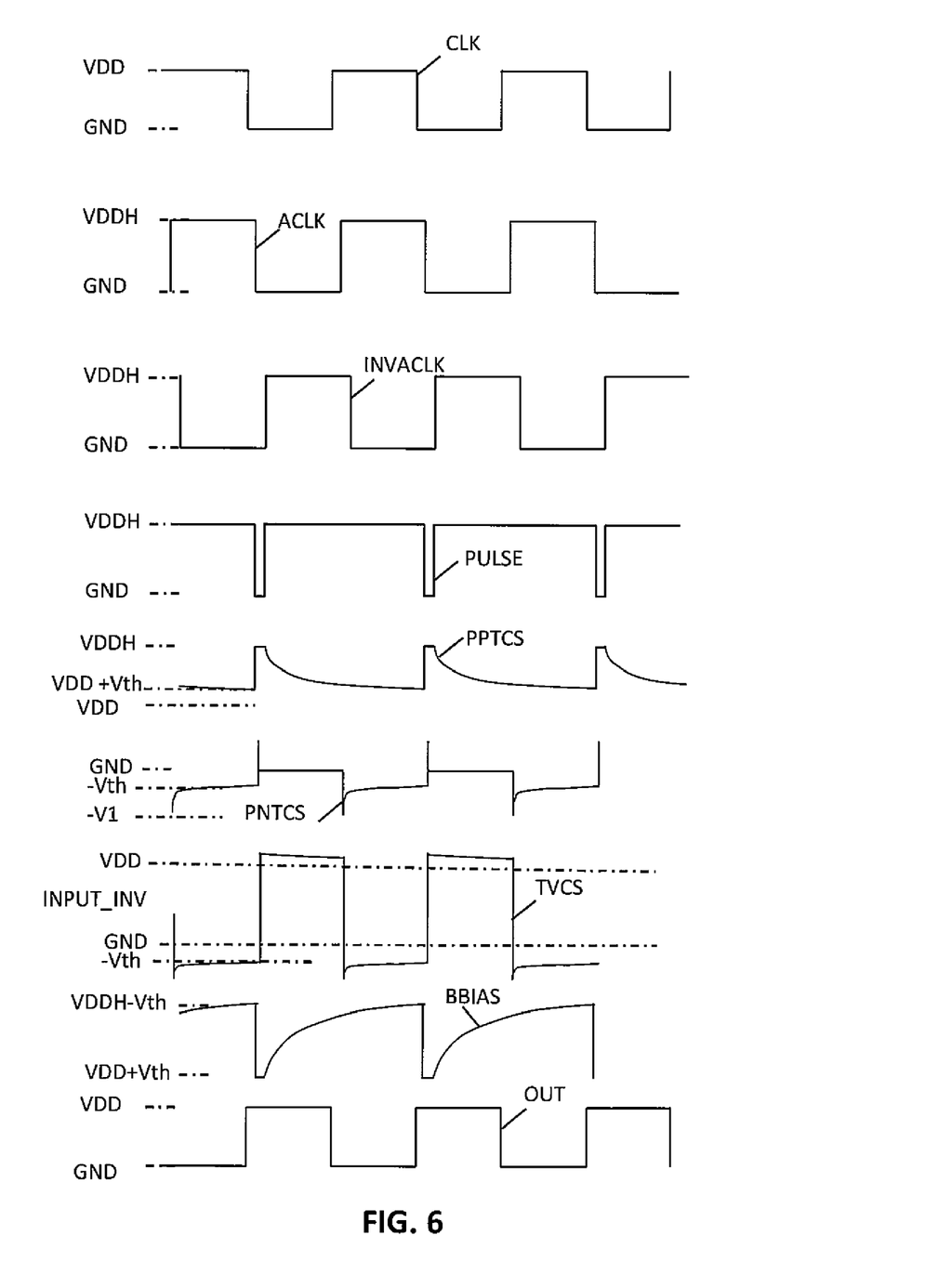
FIG. 6 illustrates waveforms at various nodes in the inverter circuit of FIG. 1 in response to an input digital signal in accordance with a preferred embodiment of the present invention.

Referring to FIG. 6 there are illustrated waveforms at various nodes in the inverter circuit 100 in response to an input digital signal CLK received at the inverter circuit input node in accordance with a preferred embodiment of the present invention. As illustrated, the input digital signal CLK is a 50% duty cycle clock signal, however, the input digital signal CLK can be any suitable digital signal such as a digital signal with short logic one or zero pulse durations of virtually any duty cycle. Also, the input digital signal CLK changes between two steady states, the values of theses steady states are the primary voltage VDD and the ground potential GROUND.

In operation the digital signal amplitude converter 110 receives the input digital signal CLK at the amplitude converter input 115 and the digital signal amplitude converter 110 converts the input digital signal CLK into an amplified digital signal ACLK, supplied at the amplitude converter output 120, that changes its steady state value between the secondary voltage VDDH and ground potential GROUND. More specifically, when the input digital signal CLK is at the primary voltage VDD the transistors Q5, Q6 and Q10 are conducting (switched on) and transistors Q7, Q8 and Q9 are non-conducting (switched off) and therefore the amplitude converter output 120 is pulled down to the ground potential GROUND. When the input digital signal CLK is at ground potential GROUND, the transistors Q5, Q6 and Q10 are non-conducting (switched off) and transistors Q7, Q8 and Q9 are conducting (switched on) and therefore the amplitude converter output 120 is pulled up to the secondary voltage VDDH.

The pulse generator 310 receives the amplified digital signal ACLK and provides pulses, in the form of a pulse signal PULSE at the pulse generator output that changes value between the secondary voltage VDDH and the ground potential GROUND. This is achieved by the output of the OR gate 330 proving a pulse only when both its inputs are at the ground potential. One input 340 of the OR gate 330 receives the amplified digital signal ACLK and the second input 350 of the OR gate 330 receives an inverted amplified digital signal INVACLK. The inverted amplified digital signal INVACLK is an inverted and delayed version of the amplified digital signal ACLK and thus both signals ACLK and INVACLK are the ground potential GROUND for a short duration during each of their cycles.

The pulse signal PULSE is received at the gate of the first transistor Q11. When the pulse signal PULSE is at the ground potential GROUND the first transistor Q11 becomes conductive (switched on) and therefore the positive threshold voltage compensation generator output 135 provides a pulsed positive threshold compensation signal PPTCS that is pulled up to the secondary voltage VDDH. When the pulse signal PULSE returns to the secondary voltage VDDH the first transistor Q11 becomes non-conductive (switched off) and the second transistor Q12 functions as a diode connected load. As a result, the pulsed positive threshold compensation signal PPTCS, at the threshold voltage compensation generator output 135, decays from the secondary voltage VDDH towards the primary voltage VDD. The pulsed positive threshold compensation signal PPTCS decays because the second transistor Q12 transitions relatively slowly from a conductive state to a state where its source to gate potential (and also its drain to source potential) essentially equals the gate to source threshold voltage Vth of the second transistor Q12. However, if the input digital signal CLK is slow enough then the pulsed positive threshold compensation signal PPTCS will decay below the gate to source threshold voltage Vth of the second transistor Q12 due to sub-threshold leakage. Accordingly, for most applications the threshold voltage compensation generator 125 provides, at the threshold voltage compensation generator output 135, the pulsed positive threshold compensation signal PPTCS that decays from the secondary voltage VDDH to a potential approximately equal to the primary voltage VDD plus the threshold voltage Vth of the second transistor Q12.

It should be apparent to a person skilled in the art that all the transistors Q1 to Q15 that form the inverter circuit 100 are part of the same silicon chip and therefore they all have the same gate to source threshold voltage Vth. It will therefore be understood that the reference to a gate to source threshold voltage Vth of one of the transistors Q1 to Q15 can be suitably interchanged to refer to an identical gate to source threshold voltage Vth any other of the transistors Q1 to Q15.

The negative threshold voltage compensation generator 140 receives the input digital signal CLK and provides a pulsed negative threshold compensation signal PNTCS. The pulsed negative threshold compensation signal PNTCS includes pulses that decay exponentially from a first negative voltage $-V1$ to a lower negative voltage approximately equal to the magnitude of the gate to source threshold voltage Vth associated with the pair of series coupled field effect transistors Q1, Q2 forming the inverter module 185. However, if the input digital signal CLK is slow enough then the pulsed negative threshold compensation signal PNTCS will decay to ground due to sub-threshold leakage. More specifically, when the input digital signal CLK is at the primary voltage VDD, the N-type field effect transistor Q13 is conducting (switched on). Consequently, the load capacitor C1 discharges to the ground potential GROUND whilst the coupling capacitor Cc is charged to the primary voltage VDD. Since the voltage across the load capacitor C1 is essentially the pulsed positive threshold compensation signal PPTCS, the pulsed positive threshold compensation signal PPTCS will be at the ground potential GROUND.

When the input digital signal CLK is at the ground potential GROUND, the N-type field effect transistor Q13 is non-conducting (switched off). The coupling capacitor Cc therefore discharges through the gate to source electrode of the transistor Q13 until the voltage across the coupling capacitor Cc is equal to the gate to source threshold voltage Vth of transistor Q13. As a result, the voltage across the load capacitor C1 will be charged negatively with a charge spike equal to the first negative voltage $-V1$ and then decay exponentially to a lower negative voltage $-V$th and therefore the pulsed negative threshold compensation signal PNTCS that includes pulses that decay exponentially from the first negative voltage $-V1$ to a lower negative voltage approximately equal to $-V$th.

The multiplexer provides a threshold voltage compensation signal TVCS to the inverter module input. The threshold voltage compensation signal TVCS is a combination of the pulsed positive threshold compensation signal PPTCS and pulsed negative threshold compensation signal PNTCS. When the input digital signal CLK is at the primary voltage VDD, a section of the pulsed positive threshold compensation signal PPTCS is multiplexed to provide one part of the threshold voltage compensation signal TVCS. Similarly, when the input digital signal CLK is at the ground potential GROUND, a section of the pulsed negative threshold compensation signal PNTCS is multiplexed to provide another part of the threshold voltage compensation signal TVCS. The threshold voltage compensation signal TVCS therefore changes between approximately VDD+Vth to $-V$th at a frequency equal to the frequency of the input digital signal CLK.

The back biasing voltage generator 195 receives a pulsed signal PS from the pulse generator output 126 that provides pulses that rise and fall between the ground potential GROUND and the secondary voltage VDDH. This pulsed signal PS is the inverse of the pulse signal PULSE When the pulsed signal PS is at the secondary voltage VDDH, the first transistor Q14 is conducting (switched on) and the common node 510 is therefore at the primary voltage VDD plus the threshold voltage Vth. When the pulsed signal PS is at the ground potential GROUND, the first transistor Q14 is non-conducting (switched off) and the common node 510 is pulled up by the second transistor Q15 to the secondary voltage VDDH minus the threshold voltage Vth. Since the output coupling capacitor OCC couples the common node 510 to the output 197 back biasing voltage generator 195, then the output 197 provides the back biasing voltage BBIAS that varies between VDD+Vth and VDDH-Vth as shown in the illustrated waveforms. Where threshold voltage Vth is the threshold voltage of the P-type field effect transistor Q1, however, as mentioned above this threshold voltage Vth is the same for any of the transistors Q1 to Q15 that form the inverter circuit 100.

In response to the inverter module 185 receiving the threshold voltage compensation signal TVCS at the inverter module input 190, the inverter circuit output node 108 provides an output digital signal OUT that is an inverted version of the input digital signal CLK. More specifically the threshold voltage compensation signal TVCS is provided to the inverter module input 190 and controls switching of the pair of series coupled field effect transistors Q1 and Q2. Since the values of the threshold voltage compensation signal TVCS change between VDD+Vth an $-V$th, threshold voltage compensation signal TVCS at least partially compensates for variations in the gate to source threshold voltage Vth associated with the switching of the transistors Q1 and Q2.

Figure 7:
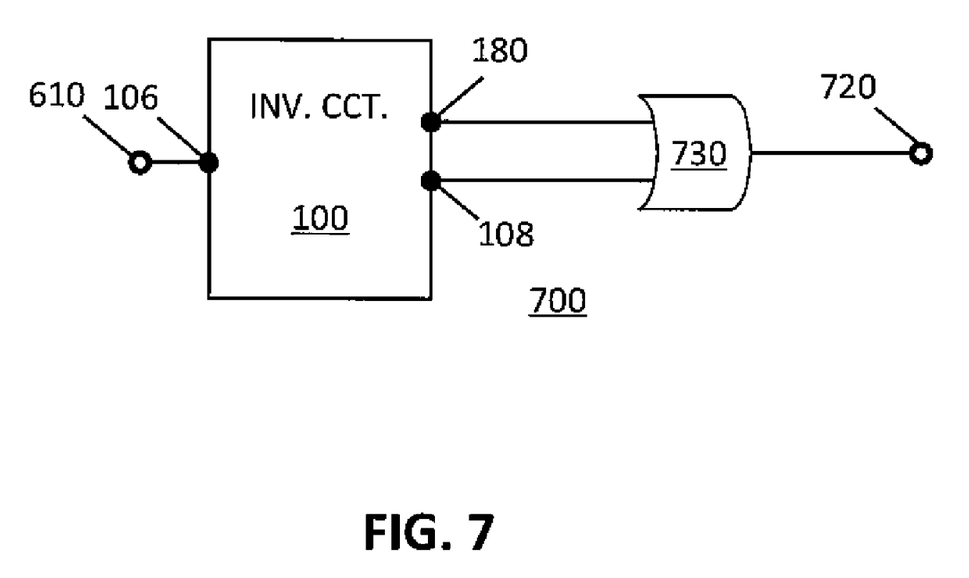
FIG. 7 illustrates an embodiment of a pulse generator that includes the inverter circuit of FIG. 1.

Referring to FIG. 7 there is illustrated an embodiment of a pulse generator 700 that includes the inverter circuit 100. The pulse generator 700 has a pulse generator clock input 710 and a pulse generator output 720. The pulse generator clock input 710 is coupled to the inverter circuit input node 106. The inverter circuit output node 108 is coupled to a first input of a logic gate that in this example is an OR gate 730 that has an output providing the pulse generator output 720. The multiplexer output 180 is also used as an output of the inverter circuit 100 and the multiplexer output 180 is coupled to a second input of the OR gate 730. Advantageously, the pulse generator 700 design generates pulses of a width that will not be vary substantially due to threshold voltage Vth variations caused when manufacturing tolerances.

Advantages of the present invention can be seen by referring to simulation results listed in tables 1 and 2 provided below. In table 1, a comparison of transition times and delays when there is no manufacturing tolerance causing variations in the threshold voltage Vth (ideal situation) is shown. The rise and fall times, and rise and fall delays, for the inverter circuit 100 are much faster than a typical prior art inverter circuit.

TABLE 1

|  | Inverter Circuit 100 | Prior Art Inverter | % Improvement |
| --- | --- | --- | --- |
| Rise Time | 36 pico secs. | 42 pico secs. | 14.2% |
| Fall Time | 41 pico secs. | 56 pico secs. | 26.7% |
| Fall Delay | 22 pico secs. | 23 pico secs. | 4.3% |
| Rise Delay | 20 pico secs. | 31 pico secs. | 35.4% |

Similarly, in table 2 a comparison of transition times and delays when the threshold voltage Vth is at the maximum manufacturing tolerance (worst case) is shown. The rise and fall times, and rise and fall delays, for the inverter circuit 100 are much faster than a typical prior art inverter circuit. More specifically, the simulation results shown that greater threshold voltage Vth variations affect variations in response times of the inverter circuit 100 lesser than they affect variations in response times of the typical prior art inverter. Consequently, the present invention at least partially compensates for variations in threshold voltages Vth caused by manufacturing tolerances (process variations).

TABLE 2

|  | Inverter Circuit 100 | Prior Art Inverter | % Improvement |
| --- | --- | --- | --- |
| Rise Time | 36 pico secs. | 70 pico secs. | 48.7% |
| Fall Time | 58 pico secs. | 97 pico secs. | 40.2% |
| Fall Delay | 42 pico secs. | 58 pico secs. | 27.5% |
| Rise Delay | 46 pico secs. | 68 pico secs. | 32.3% |

The present invention reduces the variations in transistor drain current ID caused by process variations due to manufacturing tolerances. The drain current Id which is a function of gate voltage (Vg), source voltage (Vs) and threshold Voltage Vth. The value of the drain current Id can be expressed in a simple equation Id=fn(Vg−Vs−Vth). AS the present invention attempts to alleviate or eliminate the effects of process variations of the threshold voltage Vth on the drain current Id so that the ideally the drain current Id=fn(Vg−Vs). However, in practice the process variations of the threshold voltage Vth may still have a reduced effect on the drain current Id.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A inverter circuit with compensation for threshold voltage variations, the inverter circuit comprising:
    a ground reference node, a primary voltage supply node, a secondary voltage supply node, an inverter circuit input node and an inverter circuit output node;
    a digital signal amplitude converter having an amplitude converter input, coupled to the inverter circuit input node, and an amplitude converter output, the digital signal amplitude converter being coupled to the secondary supply node and the ground reference node;
    a positive threshold voltage compensation generator having a positive threshold voltage compensation generator input, coupled to the amplitude converter output, and a positive threshold voltage compensation generator output, the positive threshold voltage compensation generator being coupled to the secondary supply node and the primary voltage supply node;
    a negative threshold voltage compensation generator having a negative threshold voltage compensation generator input, coupled to the inverter circuit input node, and a negative threshold voltage compensation generator output;
    a multiplexer having a first input, coupled to the positive threshold voltage compensation generator output, a second input, coupled to the negative threshold voltage compensation generator output, and a multiplexer output; and
    an inverter module with an output providing the inverter circuit output node, the inverter module having an inverter module input coupled to the multiplexer output and being coupled to the primary supply node and ground reference node.

2. The inverter circuit of claim 1, wherein the inverter module includes a pair of series coupled field effect transistors in the form of a P-type field effect transistor and an N-type field effect transistor, wherein gates of the P-type field effect transistor and N-type field effect transistor are coupled to the inverter module input, and wherein a source electrode of the P-type field effect transistor is coupled to the primary voltage supply node and a source electrode of the N-type field effect transistor is coupled to the ground reference node.

3. The inverter circuit of claim 2, wherein the P-type field effect transistor and the N-type field effect transistor are directly coupled to each other at the inverter circuit output node.

4. The inverter circuit of claim 3, wherein a substrate electrode of the P-type field effect transistor is coupled an output of a back biasing voltage generator, and wherein the output of back biasing voltage varies between then primary voltage plus the threshold voltage of the P-type field effect transistor and the secondary voltage minus the threshold voltage of the P-type field effect transistor.

5. The inverter circuit of claim 4, wherein the threshold voltage compensation signal controls switching of the pair of series coupled field effect transistors and at least partially compensates for a threshold voltage associated with the switching.

6. The inverter circuit of claim 2, wherein in operation the digital signal amplitude converter receives an input digital signal at the amplitude converter input that changes value between a primary voltage supplied by the primary voltage supply node and ground potential corresponding to a potential at the ground reference node, wherein the digital signal amplitude converter converts the input digital signal into an amplified digital signal supplied at the amplitude converter output, which changes value between a secondary voltage, supplied by the secondary voltage supply node and the ground potential.

7. The inverter circuit of claim 6, wherein the secondary voltage is at least 20% greater than the primary voltage and no more than 30% greater than the primary voltage.

8. The inverter circuit of claim 6, wherein the secondary voltage is at least equal to a sum of the primary voltage and a maximum possible gate to source threshold voltage associated with the pair of series coupled field effect transistors forming the inverter module.

9. The inverter circuit of claim 6, wherein the positive threshold voltage compensation generator includes a pulse generator with a pulse generator input providing the positive threshold voltage compensation generator input, and a pulse generator output, and wherein in operation the pulse generator receives the amplified digital signal and provides pulses at the pulse generator output that change value between the secondary voltage and ground potential.

10. The inverter circuit of claim 9, wherein the positive threshold voltage compensation generator includes two series connected field effect transistors coupled between the secondary voltage supply node and the primary voltage supply node, a first of the series connected field effect transistors having a gate coupled to the pulse generator output and another electrode coupled directly to the secondary voltage supply node, and wherein a second one of the series connected field effect transistors has both a gate and drain electrode coupled to the primary voltage supply node.

11. The inverter circuit of claim 10, wherein one electrode of each the series connected field effect transistors are directly coupled together at the positive threshold voltage compensation generator output.

12. The inverter circuit of claim 11, wherein the positive threshold voltage compensation generator provides a pulsed positive threshold compensation signal that decays from the secondary voltage to a potential approximately equal to the primary voltage plus a gate to source threshold voltage of the series connected field effect transistors.

13. The inverter circuit of claim 12, wherein the negative threshold voltage compensation generator provides a pulsed negative threshold compensation signal that includes pulses that decay exponentially from a first negative voltage to a lower negative voltage approximately equal to a magnitude of a gate to source threshold voltage associated with the pair of series coupled field effect transistors forming the inverter module.

14. The inverter circuit of claim 13, wherein the multiplexer provides a threshold voltage compensation signal to the inverter module input, the threshold voltage compensation signal being a combination of the pulsed positive threshold compensation signal and pulsed negative threshold compensation signal.

15. A inverter circuit with compensation for threshold voltage variations, the inverter circuit comprising:
a ground reference node, a primary voltage supply node, a secondary voltage supply node, an inverter circuit input node and an inverter circuit output node;
a digital signal amplitude converter having an amplitude converter input coupled to the inverter circuit input node, and an amplitude converter output, the digital signal amplitude converter being coupled to the secondary supply node and the ground reference node;
a positive threshold voltage compensation generator having a positive threshold voltage compensation generator input coupled to the amplitude converter output, and a positive threshold voltage compensation generator output, the positive threshold voltage compensation generator being coupled to the secondary supply node and the primary voltage supply node;
a negative threshold voltage compensation generator having a negative threshold voltage compensation generator input, coupled to the inverter circuit input node, and a negative threshold voltage compensation generator output;
a multiplexer having a first input coupled to the positive threshold voltage compensation generator output, a second input coupled to the negative threshold voltage compensation generator output, and a multiplexer output; and
an inverter module comprising a pair of series connected transistors, with an output providing the inverter circuit output node, the inverter module having an inverter module input coupled to the multiplexer output and being coupled to the primary supply node and ground reference node,
wherein in operation an input digital signal is supplied to the inverter circuit input node, the input digital signal being a signal that changes value between a primary voltage supplied by the primary voltage supply node and a ground potential corresponding to a potential at the ground reference node, and the inverter circuit processes the input digital signal into a threshold voltage compensation signal provided to the inverter module input, and wherein the threshold voltage compensation signal controls switching of the pair of series connected transistors and at least partially compensates for variations in a threshold voltage associated with the switching.

16. The inverter circuit of claim 15, wherein in operation the digital signal amplitude converter receives the input digital signal at the amplitude converter input, and the digital signal amplitude converter converts the input digital signal into an amplified digital signal supplied at the amplitude converter output, wherein the amplitude converter output changes value between a secondary voltage supplied by the secondary voltage supply node, and the ground potential.

17. The inverter circuit of claim 16, wherein the positive threshold voltage compensation generator provides a pulsed positive threshold compensation signal that decays from the secondary voltage to a potential approximately equal to the primary voltage plus a gate to source threshold voltage of the series connected transistors.

18. The inverter circuit of claim 16, wherein the negative threshold voltage compensation generator provides a pulsed negative threshold compensation signal that includes pulses that decay exponentially from a first negative voltage to a lower negative voltage approximately equal to the magnitude of a gate to source threshold voltage associated with the pair of series connected transistors.

19. The inverter circuit of claim 15, wherein the inverter circuit output node is coupled to a first input of a logic gate and the multiplexer output is coupled to a second input of the logic gate.

20. The inverter circuit of claim 15, wherein a substrate electrode of a P-type field effect transistor that is one of the pair of series connected transistors is coupled an output of a back biasing voltage generator, and wherein the output of back biasing voltage varies between the primary voltage plus the threshold voltage of the P-type field effect transistor and the secondary voltage minus the threshold voltage of the P-type field effect transistor.

* * * * *